(12) United States Patent
Abedifard

(10) Patent No.: US 6,721,206 B2
(45) Date of Patent: Apr. 13, 2004

(54) METHODS OF ACCESSING FLOATING-GATE MEMORY CELLS HAVING UNDERLYING SOURCE-LINE CONNECTIONS

(75) Inventor: Ebrahim Abedifard, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/366,902

(22) Filed: Feb. 14, 2003

(65) Prior Publication Data

US 2003/0148575 A1 Aug. 7, 2003

Related U.S. Application Data

(62) Division of application No. 09/741,525, filed on Dec. 19, 2000.

(51) Int. Cl.[7] .................................................. G11C 16/04
(52) U.S. Cl. ........................ 365/185.26; 365/185.28; 365/185.29; 365/185.33; 365/189.01
(58) Field of Search ................ 365/185.05, 185.06, 365/185.26, 185.28, 185.29, 185.33, 189.01

(56) References Cited

U.S. PATENT DOCUMENTS

| 4,816,884 A | 3/1989 | Hwang |
| 4,996,668 A | 2/1991 | Paterson et al. |
| 5,041,886 A | 8/1991 | Lee |
| 5,106,772 A | 4/1992 | Lai |
| 5,147,816 A | 9/1992 | Gill |
| 5,371,031 A | 12/1994 | Gill |
| 5,394,002 A | 2/1995 | Peterson |
| 5,457,652 A * | 10/1995 | Brahmbhatt ............ 365/185.27 |
| 5,469,383 A | 11/1995 | McElroy |
| 5,473,179 A | 12/1995 | Hong |
| 5,523,249 A | 6/1996 | Gill |
| 5,565,371 A | 10/1996 | Gill |
| 5,646,886 A | 7/1997 | Brahmbhatt |
| 5,670,805 A | 9/1997 | Hammerl |
| 5,751,039 A | 5/1998 | Kauffman |
| 5,787,457 A | 7/1998 | Miller |
| 5,808,336 A | 9/1998 | Miyawaki |
| 5,831,301 A | 11/1998 | Horak |
| 5,850,093 A | 12/1998 | Tarng |
| 5,986,934 A | 11/1999 | Kao |
| 6,017,795 A | 1/2000 | Hsieh |

(List continued on next page.)

OTHER PUBLICATIONS

Micron Semiconductor Products, Inc., "2Mb, Smart 5 BIO-S–Optimized Boot Block Flash Memory," *Flash Memory* www.micron.com, copyright 2000, Micron Technology, Inc., pp. 1–12.

*Primary Examiner*—Thien F Tran
(74) *Attorney, Agent, or Firm*—Leffert Jay & Polglaze P.A.; Thomas W. Leffert

(57) ABSTRACT

Floating-gate memory cells having a trench source-line contact are suited for increased packing densities without a need for low-resistance ground straps placed at regular intervals across a memory array. Such floating-gate memory cells have their drain regions and source regions formed in a first semiconductor region having a first conductivity type. This first semiconductor region is separated from the underlying substrate by an interposing second semiconductor region having a second conductivity type different from the first conductivity type. The source regions of the memory cells are coupled to the second semiconductor region as a common source line. Such memory cells can be programmed, read and erased by applying various potential levels to their control gates, their drain regions, the first semiconductor region, and the second semiconductor region.

23 Claims, 7 Drawing Sheets

U.S. PATENT DOCUMENTS

| | | |
|---|---|---|
| 6,025,224 A | 2/2000 | Gall |
| 6,026,465 A | 2/2000 | Mills |
| 6,040,210 A | 3/2000 | Burns, Jr. |
| 6,077,745 A | 6/2000 | Burns, Jr. |
| 6,093,606 A | 7/2000 | Lin |
| 6,103,577 A | 8/2000 | Horng |
| 6,137,133 A | 10/2000 | Kauffman |
| 6,141,247 A | 10/2000 | Roohparvar |
| 6,147,378 A | 11/2000 | Liu |
| 6,157,574 A | 12/2000 | Kalnitsky |
| 6,159,803 A | 12/2000 | Hong |

* cited by examiner

METHODS OF ACCESSING FLOATING-GATE MEMORY CELLS HAVING UNDERLYING SOURCE-LINE CONNECTIONS

RELATED APPLICATION

This application is a divisional of U.S. patent application Ser. No. 09/741,525 (pending), filed Dec. 19, 2000 and titled, "FLASH CELL WITH TRENCH SOURCE-LINE CONNECTION," which is commonly assigned and incorporated by reference in its entirety herein.

TECHNICAL FIELD OF THE INVENTION

The present invention relates generally to semiconductor memory devices, and in particular, the present invention relates to flash memory cells having trench source-line connections and their operation.

BACKGROUND OF THE INVENTION

Electronic information handling or computer systems, whether large machines, microcomputers or small and simple digital processing devices, require memory for storing data and program instructions. Various memory systems have been developed over the years to address the evolving needs of information handling systems. One such memory system includes semiconductor memory devices.

Semiconductor memory devices are rapidly-accessible memory devices. In a semiconductor memory device, the time required for storing and retrieving information generally is independent of the physical location of the information within the memory device. Semiconductor memory devices typically store information in a large array of cells.

Computer, communication and industrial applications are driving the demand for memory devices in a variety of electronic systems. One important form of semiconductor memory device includes a non-volatile memory made up of floating-gate memory cells called flash memory. Flash memory is often used where regular access to the data stored in the memory device is desired, but where such data is seldom changed. Computer applications use flash memory to store BIOS firmware. Peripheral devices such as printers store fonts and forms on flash memory. Digital cellular and wireless applications consume large quantities of flash memory and are continually pushing for lower voltages and higher densities. Portable applications such as digital cameras, audio recorders, personal digital assistants (PDAs) and test equipment also use flash memory as a medium to store data.

Conventional flash memory cells make use of a floating-gate transistor. In such devices, access operations are carried out by applying biases to the source, drain and control gate of the transistor. Write operations are generally carried out by channel hot-carrier injection. This process induces a flow of electrons between the source and the drain, and accelerates them toward a floating gate in response to a positive bias applied to the control gate. Read operations generally include sensing a current between the source and the drain, i.e., the MOSFET current, in response to a bias applied to the control gate. Erase operations are generally carried out through Fowler-Nordheim tunneling. This process may include electrically floating the drain, grounding the source, and applying a high negative voltage to the control gate.

Designers are under constant pressure to increase the density of flash memory devices. Increasing the density of a flash memory device entails fabricating greater numbers of memory cells in the same area, or real estate, of an integrated circuit die. To do so generally requires closer packing of individual memory cells, thus reducing spacing between memory cells. It is becoming increasingly difficult to further reduce spacing between memory cells. Closer packing also generally requires smaller dimensions of device elements. Smaller dimensions of many device elements, such as conductive traces or lines, leads to increased resistance. This increased resistance detrimentally impacts the speed and power requirements of the memory device.

One approach commonly used to reduce resistance from the source regions of the memory cells is to couple multiple source regions of adjacent rows into a source line. Each source line generally extends for several columns, e.g., 16 columns. These source lines are then coupled to a low-resistance strap, often a metal line in the metal-I layer of the integrated circuit fabrication process. As the resistance of the source lines increases due to reducing line widths, it is generally necessary to reduce the spacing of these low-resistance straps to manage resistance levels to the memory cells located farthest from the straps. This results in increasing numbers of metal lines and counterproductive use of semiconductor die area.

For the reasons stated above, and for other reasons stated below that will become apparent to those skilled in the art upon reading and understanding the present specification, there is a need in the art for alternate architectures for arrays of floating-gate memory cells, apparatus making use of such memory arrays, and methods of their fabrication and operation.

SUMMARY OF THE INVENTION

The above-mentioned problems with memory devices and other problems are addressed by the present invention and will be understood by reading and studying the following specification.

As packing of floating-gate memory cells becomes more dense, resistance levels of source-line connections become more difficult to manage. Floating-gate memory cells of the various embodiments are formed in a first semiconductor region having a first conductivity type. This first semiconductor region is separated from the underlying substrate by an interposing second semiconductor region having a second conductivity type different from the first conductivity type. The source regions of the memory cells are coupled to the second semiconductor region as a common source line. In this manner, source-line resistance is improved without the need for metal lines or other low-resistance straps placed at regular intervals across the memory array, thus permitting tighter packing of memory cells.

For one embodiment, the invention provides a floating-gate memory cell. The memory cell includes a gate stack having a control-gate layer and having a floating-gate layer interposed between the control-gate layer and a first semiconductor region having a first conductivity type. The memory cell further includes a drain region in the first semiconductor region and a source region in the first semiconductor region. The drain region and the source region have a second conductivity type different from the first conductivity type. The source region is coupled to a second semiconductor region underlying the first semiconductor region, wherein the second semiconductor region has the second conductivity type.

For another embodiment, the invention provides a floating-gate memory cell. The memory cell includes a tunnel dielectric layer overlying an upper well region, wherein the upper well region has a p-type conductivity. The memory cell further includes a floating-gate layer overlying the tunnel dielectric layer, an intergate dielectric layer overlying the floating-gate layer, a control-gate layer overlying the intergate dielectric layer, a drain region in the upper well region, and a source region in the upper well region. The drain region and the source region each have an n-type conductivity. The source region is coupled to a lower well region underlying the upper well region and having an n-type conductivity. The lower well region is formed in a semiconductor substrate having the p-type conductivity.

For yet another embodiment, the invention provides a memory device. The memory device includes a substrate having a first conductivity type, a lower well region formed in the substrate, and an upper well region formed in the lower well region. The upper well region has the first conductivity type and the lower well region has a second conductivity type different from the first conductivity type. The memory device further includes a plurality of word lines, a plurality of bit lines, and a plurality of floating-gate memory cells. Each floating-gate memory cell includes a control-gate layer for coupling to one of the plurality of word lines, a floating-gate layer interposed between the control-gate layer and the upper well region, a drain region in the upper well region for coupling to one of the plurality of bit lines, a source region in the upper well region, and a source-line contact extending below the source region to the lower well region. The drain region and the source region each have the second conductivity type. The source-line contact couples the source region to the lower well region either directly, e.g., extending through the source region, or indirectly, e.g., laterally displaced yet in electrical contact with the source region.

For still another embodiment, the invention provides a method of erasing a floating-gate memory cell. The method includes applying a first potential to a control gate of the floating-gate memory cell. The floating-gate memory cell has a drain region and a source region formed in a first well region having a first conductivity type. The first well region is formed in a second well region having a second conductivity type different from the first conductivity type. The method further includes applying a second potential to the first well region and the second well region. The second potential is higher than the first potential and the second well region is coupled to the source region.

For a further embodiment, the invention provides a method of forming a memory cell. The method includes forming a gate stack on a first semiconductor region having a first conductivity type. The first semiconductor region is enclosed in a second semiconductor region having a second conductivity type different from the first conductivity type. The method further includes forming source/drain regions on opposing sides of the gate stack. The source/drain regions have the second conductivity type. The method still further includes forming a source-line contact. The source-line contact is coupled between one of the source/drain regions and the second semiconductor region.

The invention further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description includes any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

Figure 1:
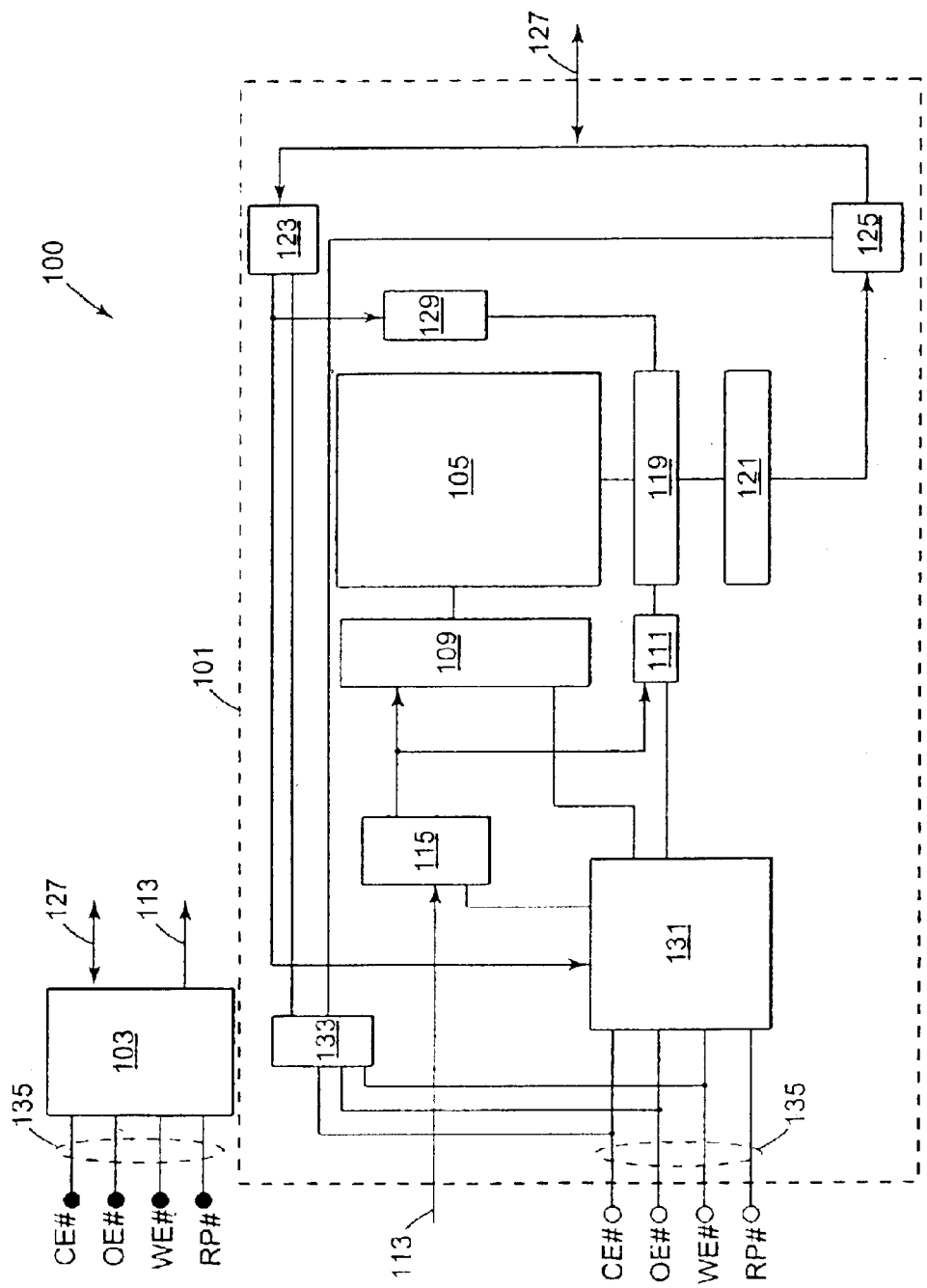
FIG. 1 is a block diagram of a basic flash memory device coupled to a processor in accordance with one embodiment of the invention.

FIG. 1 is a functional block diagram of a basic flash memory device 101 that is coupled to a processor 103. The memory device 101 and the processor 103 may form part of an electronic system 100. The memory device 101 has been simplified to focus on features of the memory that are helpful in understanding the present invention. The memory device 101 includes an array of memory cells 105. The memory cells are non-volatile floating-gate memory cells in accordance with the invention and have their gates coupled to word lines, drain regions coupled to local bit lines, and source regions coupled to an underlying semiconductor region. The memory array 105 is arranged in rows and columns, with the rows arranged in blocks. A memory block is some discrete portion of the memory array 105. Individual word lines generally extend to only one memory block while bit lines may extend to multiple memory blocks. The memory cells generally can be erased in blocks. Data, however, may be stored in the memory array 105 separate from the block structure.

A row decoder 109 and a column decoder 111 are provided to decode address signals provided on address lines A0–Ax 113. An address buffer circuit 115 is provided to latch the address signals. Address signals are received and decoded to access the memory array 105. A column select circuit 119 is provided to select a column of the memory array 105 in response to control signals from the column decoder 111. Sensing circuitry 121 is used to sense and amplify data stored in the memory cells. Data input 123 and output 125 buffer circuits are included for bi-directional data communication over a plurality of data (DQ) lines 127 with the processor 103. A data latch 129 is typically provided between data input buffer circuit 123 and the memory array 105 for storing data values (to be written to a memory cell) received from the DQ lines 127. Data amplified by the sensing circuitry 121 is provided to the data output buffer circuit 125 for output on the DQ lines 127.

Command control circuit 131 decodes signals provided on control lines 135 from the processor 103. These signals are used to control the operations on the memory array 105, including data read, data write, and erase operations. Input/output control circuit 133 is used to control the data input buffer circuit 123 and the data output buffer circuit 125 in response to some of the control signals. As stated above, the flash memory device 101 has been simplified to facilitate a basic understanding of the features of the memory. A more detailed understanding of flash memories is known to those skilled in the art.

Figure 2A:
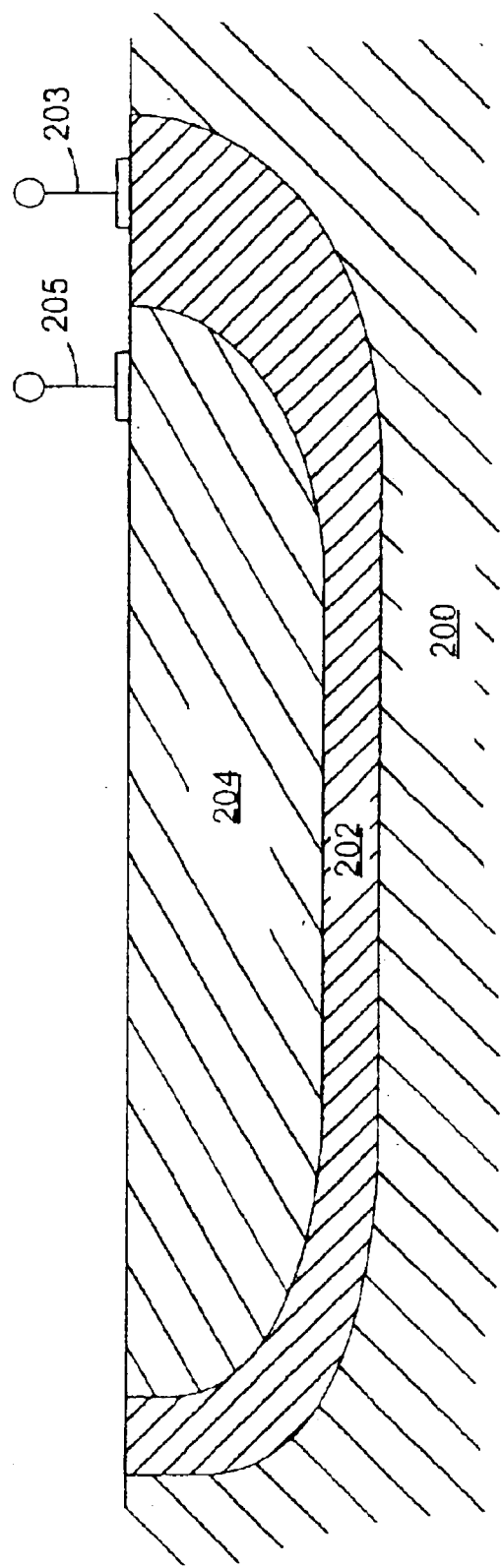
FIG. 2A is a cross-sectional view of a structure suitable for use in fabricating the floating-gate memory cells in accordance with one embodiment of the invention.

FIG. 2A is a cross-sectional view of a structure suitable for use in fabricating the memory cells of the various embodiments. Formation of such structures is well understood in the arts and will not be detailed herein. The substrate 200 has a first conductivity type, e.g., a p-type conductivity. The substrate 200 includes a lower well region 202 as a semiconductor region having a second conductivity type different from the first conductivity type. For example, the second conductivity type may be opposite the first conductivity type, e.g., an n-type conductivity opposite the p-type conductivity. The lower well region 202 may be formed in the substrate 200 through such processing methods as implantation or diffusion of dopant ions. The substrate 200 further includes an upper well region 204 as a semiconductor region having the first conductivity type. The upper well region 204 may be formed in the lower well region 202. Alternatively, the structure of the lower well region 202 and the upper well region 204 may be defined in a single operation by controlling the depth of dopant implantation to form the lower well region 202 without the need for a subsequent formation of the upper well region 204. The upper well region 204 is isolated from other portions of the substrate 200 having the first conductivity type by the lower well region 202. The lower well region 202 is underlying the upper well region 204 or otherwise interposed between the substrate 200 and the upper well region 204. The lower well region 202 has at least one contact 203 for coupling to a potential node. The upper well region 204 has at least one contact 205 for coupling to another potential node.

For one embodiment, the structure of FIG. 2A may include an n-well as the lower well region 202 formed in a p-type substrate as the substrate 200. A p-well may be formed in the n-well as the upper well region 204.

The lower well region 202 may be thought of as a tub or other container shape. The upper well region 204 fills the interior of the container, such that the upper well region 204 is enclosed in the lower well region 202, while the substrate 200 extends away from the exterior of the container. The invention, however, is not limited to a specific shape of the well regions 202 and 204 provided the upper well region 204 is separated from other areas of the substrate 200 having the same conductivity type. Such separation is provided by an interposing region of the different conductivity type, e.g., the lower well region 202.

Figure 2B:
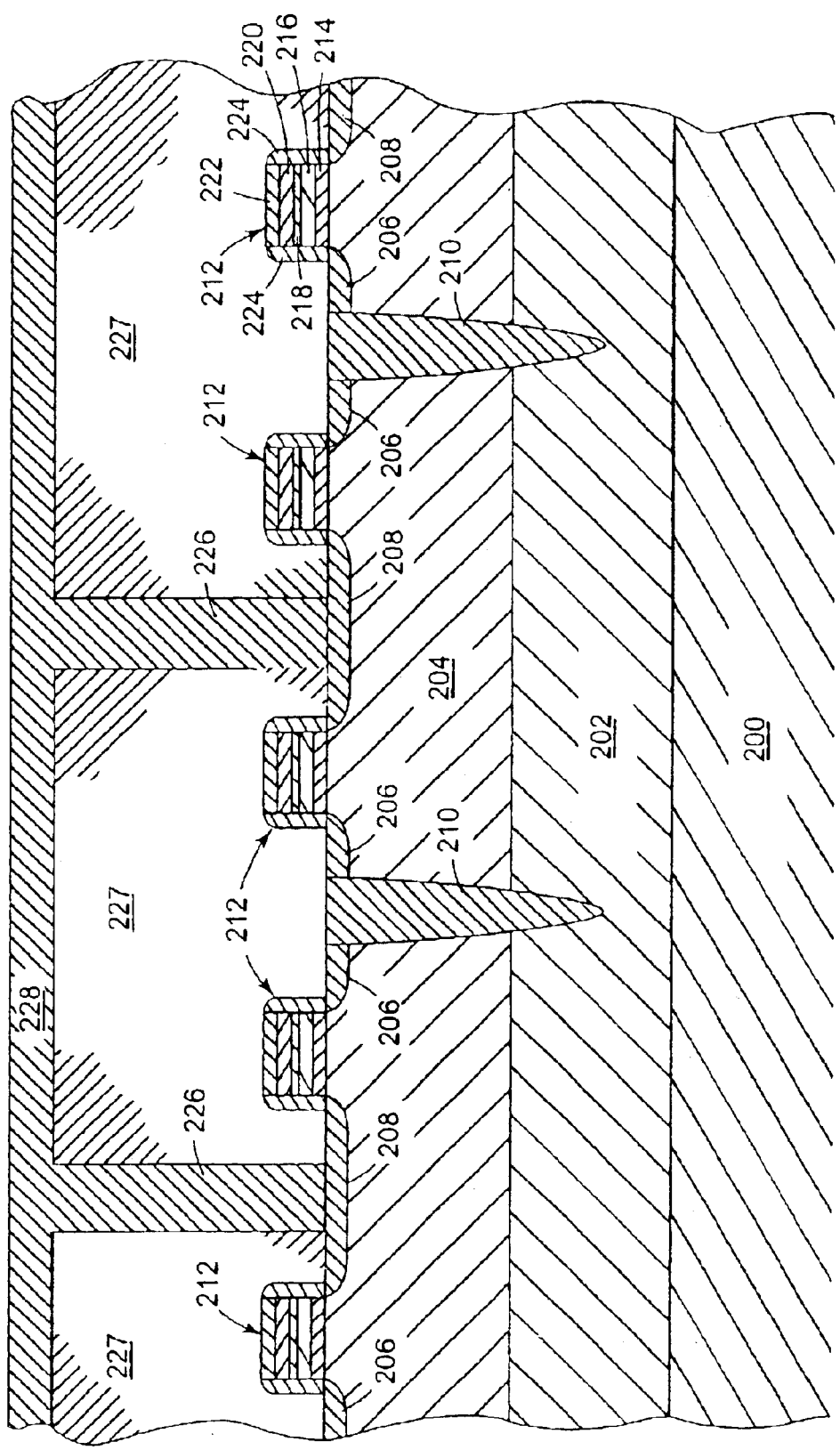
FIG. 2B is a cross-sectional view of floating-gate memory cells in accordance with one embodiment of the invention.

FIG. 2B is a cross-sectional view of floating-gate memory cells in accordance with an embodiment of the invention. Fabrication techniques are well understood in the art and will not be detailed herein.

Each floating-gate memory cell includes a gate stack 212, a source region 206 and a drain region 208. The gate stack 212 includes a tunnel dielectric layer 214, a floating-gate layer 216, an intergate dielectric layer 218 and a control-gate layer 220. The gate stack 212 is a portion of a word line of the memory device or otherwise has its control-gate layer 220 coupled to the word line. The gate stack 212 is overlying the upper well region 204. The drain regions 208 and source regions 206 are in the upper well region 204.

The tunnel dielectric layer 214 contains a dielectric material. For one embodiment, the tunnel dielectric layer 214 is an oxide. The oxide may be formed by thermal or other oxidation technique. Other dielectric materials may be used for the tunnel dielectric layer 214. Specific examples include silicon oxides, silicon nitrides and silicon oxynitrides. The tunnel dielectric layer 214 is generally formed both overlying and in contact with the upper well region 204.

The floating-gate layer 216 is formed overlying the tunnel dielectric layer 214. The floating-gate layer 216 is the layer that will store the charge indicative of a programmed state of the floating-gate memory cell. For one embodiment, the floating-gate layer 216 is a conductively-doped polysilicon layer. For a further embodiment, the polysilicon layer has an n-type conductivity. The polysilicon layer may be formed by such techniques as chemical vapor deposition (CVD) and may be conductively doped during or following formation.

The intergate dielectric layer 218 is formed overlying the floating-gate layer 216. The intergate dielectric layer 218 contains a dielectric material. Some examples include silicon oxides, silicon nitrides or silicon oxynitrides. Further examples include metal oxides such as barium strontium titanate (BST), lead zirconium titanate (PZT) and lead lanthanum titanate (PLZT). Dielectric layers may further contain multiple layers of dielectric materials. One common example is an ONO (oxide-nitride-oxide) dielectric layer.

A control-gate layer 220 is formed overlying the intergate dielectric layer 218. The control-gate layer 220 contains a conductive material. For one embodiment, the conductive material contains a conductively-doped polysilicon material. For another embodiment, the control-gate layer 220 includes one or more layers containing metals, metal alloys, metal nitrides and/or metal silicides. For a further embodiment, the control-gate layer 220 contains a metal layer overlying a metal silicide layer.

A cap layer 222 is generally formed overlying the control-gate layer 220 to act as an insulator and barrier layer. The cap layer 222 contains an insulator and may include such insulators as silicon oxide, silicon nitride, and silicon oxynitrides. For one embodiment, the cap layer 222 is silicon nitride, formed by such methods as CVD.

The tunnel dielectric layer 214, the floating-gate layer 216, the intergate dielectric layer 218, the control-gate layer 220 and the cap layer 222 are patterned to define the structure of the gate stacks 212. It is noted that additional layers may form the gate stack 212, such as barrier layers to inhibit diffusion between opposing layers or adhesion layers to promote adhesion between opposing layers. Sidewall spacers 224 may be formed on the sidewalls of the gate stacks 212 to protect and insulate the sidewalls. Sidewall spacers 224 are generally the same dielectric material as used for the cap layer 222, but may include other dielectric materials. Formation may include a blanket deposit of a layer of dielectric material on the patterned gate stacks 212 followed by an anisotropic etch to preferentially remove horizontal portions of the layer of dielectric material, leaving vertical portions adjacent the sidewalls of the gate stacks 212.

A drain region 208 and a source region 206 are formed adjacent each gate stack 212 in the upper well region 204. The drain regions 208 and source regions 206 are conductive regions having the second conductivity type different from the conductivity type of the upper well region 204. The drain regions 208 and source regions 206 are generally heavily-doped regions for increased conductivity. For one embodiment, the drain regions 208 and the source regions 206 are n+-type regions formed by implantation and/or diffusion of n-type dopants, such as arsenic or phosphorus. The edges of the drain regions 208 and the source regions 206 are generally made to coincide with, or underlap, the edges of the gate stacks 212. As an example, the drain regions 208 and the source regions 206 may be formed using angled implants or post-implant anneals to contact the channel region of the gate stack 212 below the tunnel dielectric layer 214. The channel region is that portion of the upper well region 204 extending between the drain region 208 and the source region 206 associated with a single gate stack 212.

Before or after formation of the source regions 206, a source-line contact 210 is formed to couple each source region 206 to the lower well region 202. Each source-line contact 210 may extend through a source region 206 as shown in FIG. 2B. Alternatively, a source-line contact 210 may be electrically coupled to, but laterally displaced from, a source region 206 as described with reference to FIG. 3A.

The lower well region 202 becomes the common source line for one or more blocks of memory cells. The lower well region 202 can have relatively substantial cross-sectional area for current flow to improve the source-line resistance and to eliminate the need for regularly-spaced array ground straps. Eliminating these straps allows for improved packing density of memory cells and can facilitate an array size reduction of 10–15% or more over current practice.

The source-line contact 210 extends below the source region 206 and provides electrical communication between the source region 206 and the lower well region 202. For one embodiment, the source-line contact 210 is formed by forming a contact hole exposing a portion of the lower well region 202 and filling the contact hole with a conductive fill material. The fill material will be deemed conductive if it provides electrical communication between the source region 206 and the lower well region 202. Thus, the source-line contact 210 does not preclude use of dielectric or other non-conductive materials, such as a non-conductive plug surrounded by a layer of conductive material. For example, a layer of conductive material may be formed on the sidewalls and the bottom of the contact hole, and any remaining space may be filled with a non-conductive material. Collectively, this fill combination will be deemed to be conductive fill material.

For another embodiment, the source-line contact 210 is coupled to a single source region 206. For yet another embodiment, the source-line contact 210 is coupled to more than one source region 206, such as additional source regions extending behind or in front of the plane of FIG. 2B. For a further embodiment, the conductive fill material is a conductively-doped material having the second conductivity type, e.g., an n+-type plug of conductively-doped polysilicon. For another embodiment, the contact hole has sidewalls defined by the upper well region 204 and a bottom defined by an exposed portion of the lower well region 202, where the conductive fill material includes a refractory metal silicide formed on the sidewalls and the bottom of the contact hole. For a further embodiment, the conductive fill material is a silicide or polycide filling the contact hole. For a still further embodiment, the conductive fill material includes a layer of conductive material deposited on the sidewalls and bottom of the contact hole, such as by CVD or physical vapor deposition (PVD); such deposition may continue to a point that the contact hole is filled with the conductive material. Some examples of deposited materials include metals, metal alloys and conductive metal oxides. For embodiments making use of CVD or PVD-type deposition techniques, it may be appropriate to form the source-line contacts 210 prior to formation of the gate stacks 212 to allow for planarization to remove excess material from the surface of the upper well region 204. Alternatively, a mask could be used to facilitate removal of excess material used to form the conductive fill material of the source-line contacts 210.

For yet another embodiment, the source-line contact 210 is defined by a conductively-doped region extending from the source region 206 to the lower well region 202, wherein the conductively-doped region has the second conductivity type. Such a conductively-doped region may include an implanted and/or diffused region extending from the source region 206 to the lower well region 202. The source-line contact 210 further includes other conductive paths extending below the source region 206 and providing electrical communication between the source region 206 and the lower well region 202. Following formation of the source-line contacts 210, a bit-line contact 226 is formed to each drain region 208 for coupling to a bit line 228. Bit-line contacts 226 are generally formed in a layer of dielectric material 227. The layer of dielectric material 227 often includes silicon oxides, silicon nitrides and silicon oxynitrides as previously described. For one embodiment, the layer of dielectric material 227 contains a doped silicon oxide, such as borophosphosilicate glass (BPSG), a boron and phosphorus-doped silicon dioxide material.

FIGS. 3A–3D are top views of a portion of a memory array 105 in accordance with three embodiments of the invention. FIGS. 3A–3D may each represent a portion of a memory block of the memory array 105. The memory array 105 contains floating-gate memory cells 300 arranged in rows and columns. Rows of memory cells 300 have their gate stacks 212 (not shown in FIGS. 3A–3D) coupled to the same word line 230. Columns of memory cells 300 have their drain regions 208 coupled to the same bit line 228. Although FIGS. 3A–3D show the rows and columns to be substantially orthogonal, rows could be at a diagonal from the columns.

Figure 3A:
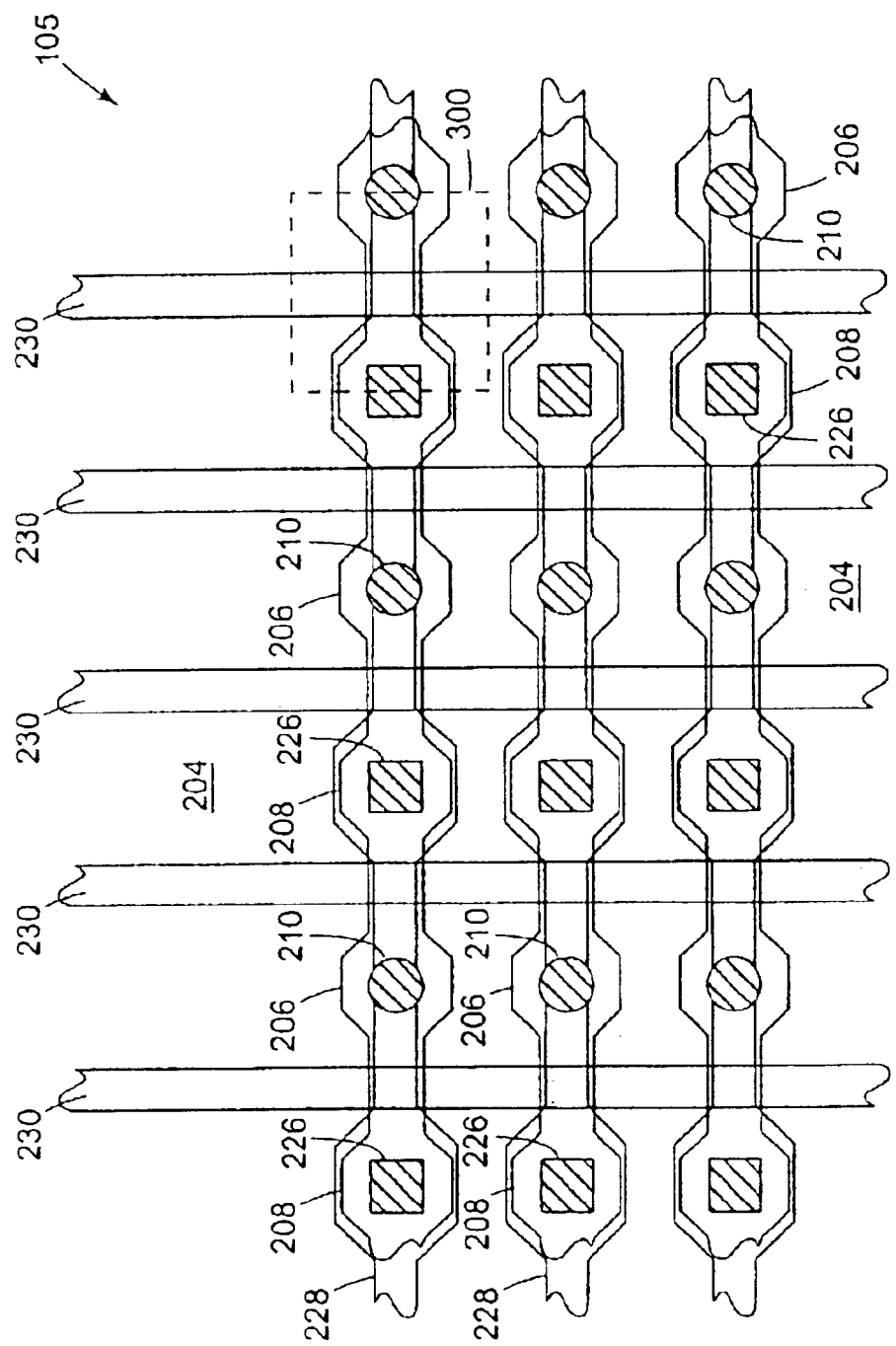
FIG. 3A is a top view of a portion of a memory array having one source region coupled to each source-line contact in accordance with one embodiment of the invention.

For the embodiment depicted in FIG. 3A, each source region 206 has a separate source-line contact 210 for coupling to the lower well region 202 (not shown in FIG. 3A). The source-line contacts 210 of FIG. 3A may include substantially cylindrical or otherwise columnar trenches. A trench structure as used herein extends below the source regions 206 to the lower well region 202. Suitable trenches can take any form. As examples, each trench can be cylindrical, rectangular, conical, ellipsoidal or some other regular or irregular geometric shape. In addition to substantially columnar structures, the trenches may be extended such that a surface dimension may exceed a depth of the trench.

The source-line contacts 210 of FIG. 3A have a one-to-one relationship with the source regions 206. While the source-line contacts 210 of FIG. 3A could have a one-to-one relationship with each memory cell 300, the source regions 206 may be shared among more than one memory cell 300. For the embodiment depicted in FIG. 3A, each source-line contact 210 is shared by two memory cells 300.

Figure 3B:
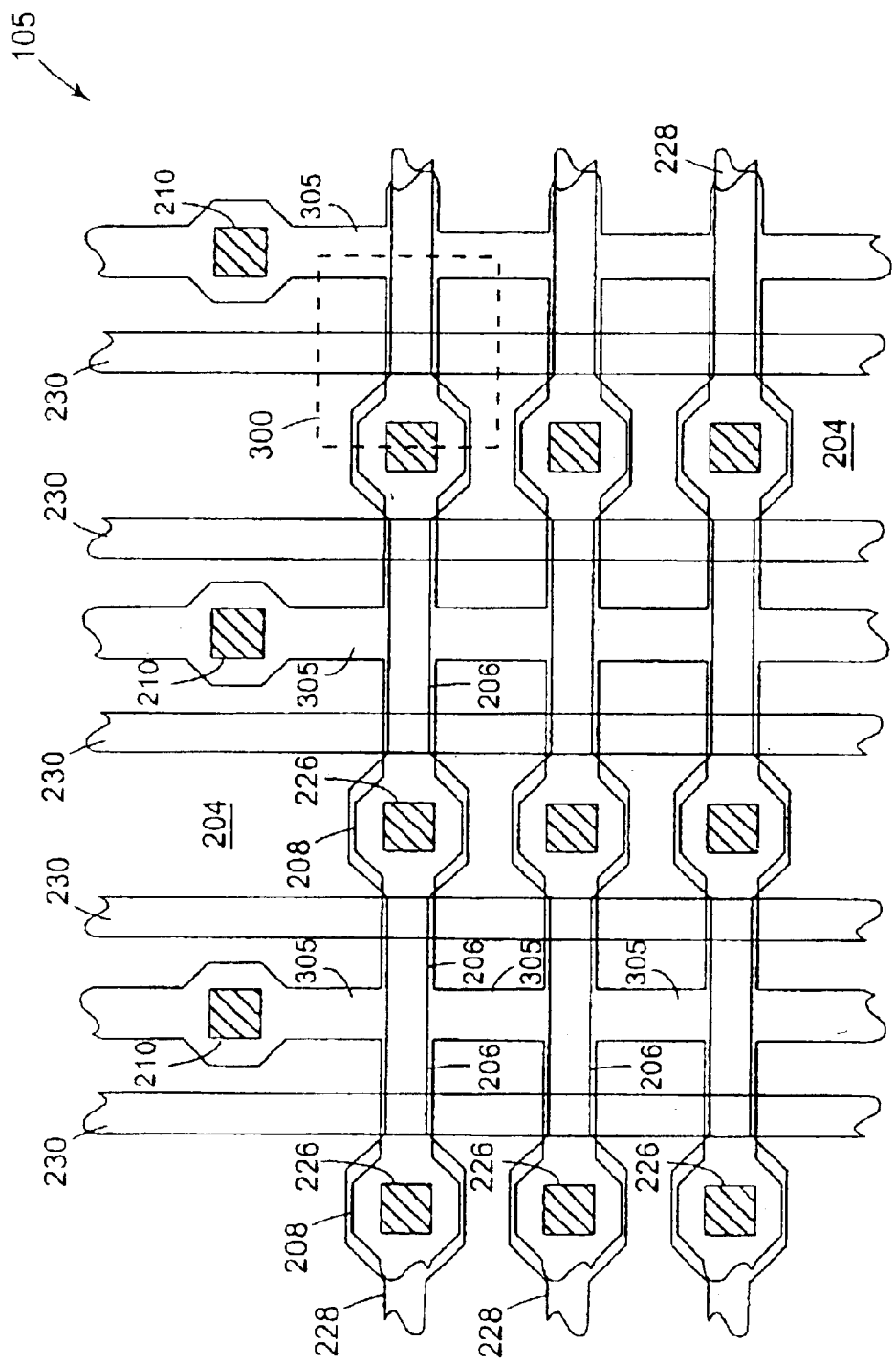
FIG. 3B is a top view of a portion of a memory array having at least one source region coupled to each source-line contact in accordance with one embodiment of the invention.
Figure 3C:
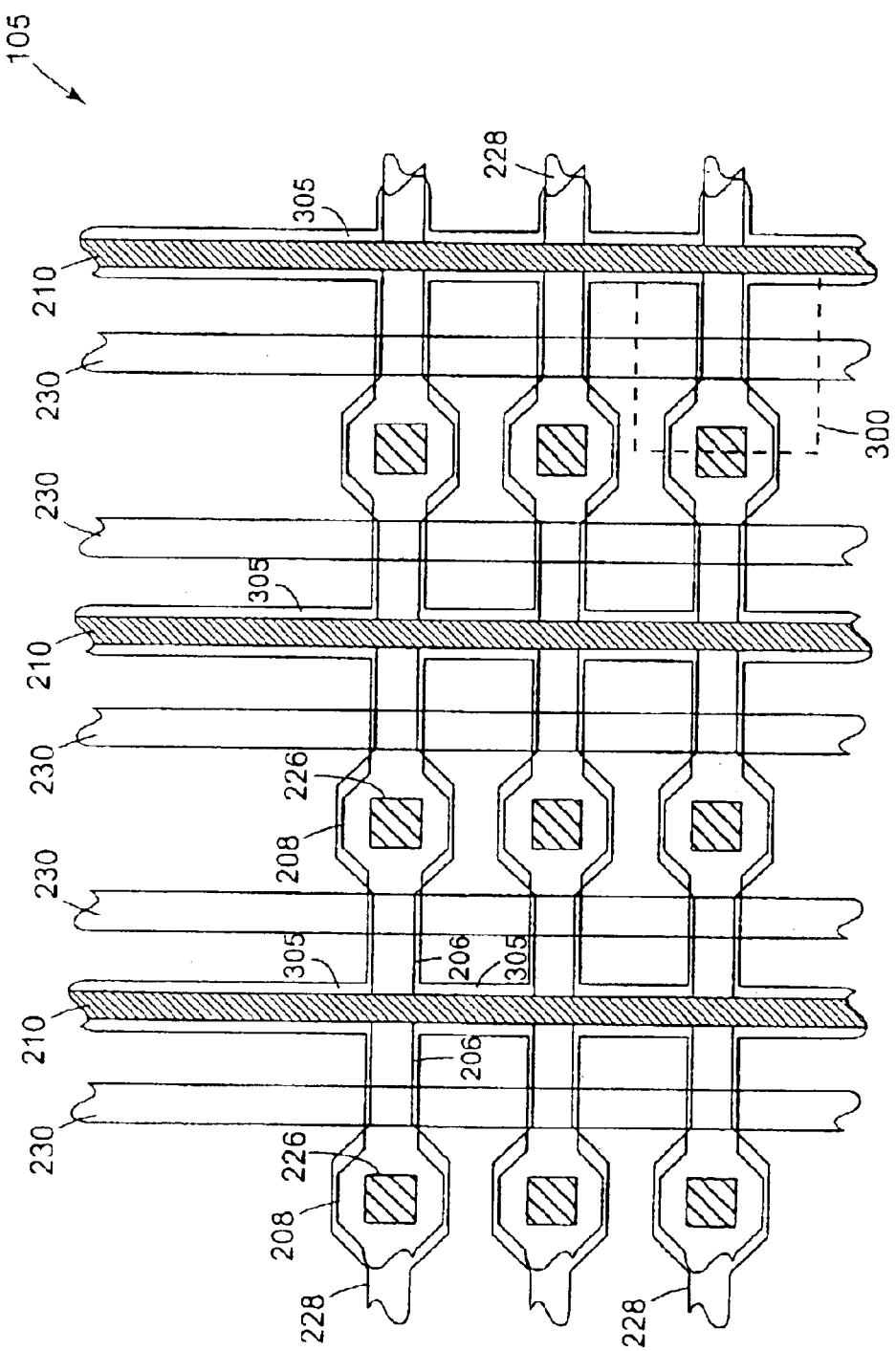
FIG. 3C is a top view of a portion of a memory array having at least one source region coupled to each source-line contact in accordance with another embodiment of the invention.
Figure 3D:
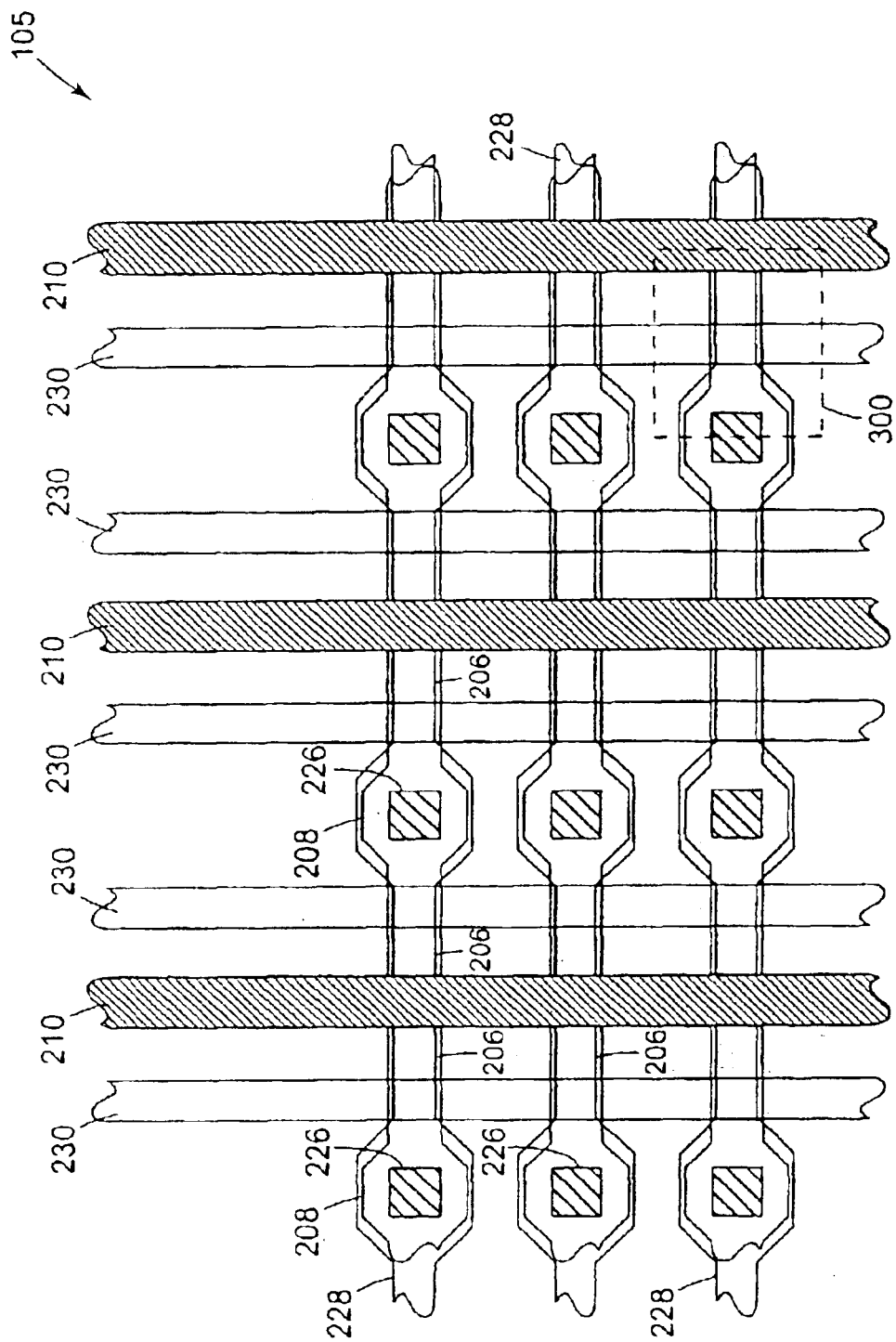
FIG. 3D is a top view of a portion of a memory array having at least one source region coupled to each source-line contact in accordance with yet another embodiment of the invention.

For the embodiments depicted in FIGS. 3B–3D, a single source-line contact 210 can be used to couple at least one and, preferably, two or more source regions 206 to the lower well region 202. This may be accomplished with columnar or extended trenches as described below.

For the embodiment depicted in FIG. 3B, a single source-line contact 210 couples at least one source region 206 to the lower well region 202 (not shown in FIG. 3B). As shown in FIG. 3B, two or more adjacent source regions 206 may be coupled to each source-line contact 210. The source-line contacts 210 of FIG. 3B are coupled to the source regions 206 through conductive traces 305. The conductive traces 305 are current paths providing electrical communication between the source-line contacts 210 and their associated source regions 206 and may be formed in or on the upper well region 204. The conductive traces 305 provide for indirect coupling of the source regions 206 to the lower well region 202. The source-line contacts 210 of FIG. 3B are depicted as rectangular columnar trenches, but may take any form providing electrical contact between the source regions 206 and the lower well region 202 through the conductive traces 305.

For one embodiment, the conductive traces 305 may be conductively-doped regions having the second conductivity type and may be formed concurrently with the formation of the source regions 206 and the drain regions 208. In this manner, the conductive traces 305 may be considered to be extensions of the source regions 206. For another embodiment, the conductive traces 305 may contain metal silicide. As an example, implantation of metal ions in the upper well region 204 followed by annealing can be used to form metal silicide regions in the upper well region 204. The conductive traces 305 could be other current paths, e.g., metal lines.

Each conductive trace 305 may be coupled to one or more source-line contacts 210. Each conductive trace 305 may further be coupled to one or more source regions 206. As such, each conductive trace 305 is coupled between at least one source-line contact 210 and at least one source region 206.

For the embodiment depicted in FIG. 3C, a single source-line contact 210 couples at least one source region 206 to the lower well region 202 (not shown in FIG. 3C). As shown in FIG. 3C, two or more adjacent source regions 206 may be coupled to each source-line contact 210. The source-line contacts 210 of FIG. 3C are depicted as extended trenches extending through two or more source regions 206. The extended trenches may be wedge shaped, but may take any form providing electrical contact between the source regions 206 and the lower well region 202. As one example, the source-line contacts 210 could have a shape similar to a comb or fork, with an unbroken surface as shown in FIG. 3C, but with multiple tines extending to the lower well region 202. Two or more adjacent source regions 206 are commonly coupled through conductive traces 305 as well as source-line contacts 210.

The embodiment depicted in FIG. 3D is similar to the embodiment of FIG. 3C except that the conductive traces 305 are eliminated. As the source-line contacts 210 provide electrical communication between the source regions 206 and the lower well region 202 (not shown in FIG. 3D), no additional conductive path is necessary between adjacent source regions 206. Two or more adjacent source regions 206 are commonly coupled through each source-line contact 210.

For one embodiment, each memory block of the memory array 105 may be formed in an upper well region 204 that is isolated from other upper well regions 204 containing other blocks of the memory array 105. Each upper well region 204 may be formed in a separate lower well region 202. Alternatively, a lower well region 202 may contain two or more upper well regions 204. For such an embodiment, each upper well region 204 is isolated from other upper well regions 204 by being laterally spaced apart within the lower well region 202.

The following discussion provides examples of programming, reading and erasing memory cells of the type described herein. During programming, a positive programming voltage, e.g., about 12 volts, is applied to the control-gate layer 220. This positive programming voltage attracts electrons from the p-type upper well region 204 and causes them to accumulate at the surface of channel region. A voltage on the drain region 208 is increased, e.g., to about 6 volts, by applying the potential to the associated bit line 228, and the source region 206 is connected to a ground potential from the lower well region 202 through its source-line contact 210. As the drain-to-source voltage increases, electrons flow from the source region 206 to the drain region 208 via the channel region. As electrons travel toward the drain region 208, they acquire substantially large kinetic energy and are referred to as hot electrons.

The voltages at the control-gate layer 220 and the drain region 208 create an electric field in the tunnel dielectric layer 214. This electric field attracts the hot electrons and accelerates them toward the floating-gate layer 216. At this point, the floating-gate layer 216 begins to trap and accumulate the hot electrons and starts a charging process. Gradually, as the charge on the floating-gate layer 216 increases, the electric field in the tunnel dielectric layer 214 decreases and eventually loses it capability of attracting any more of the hot electrons to the floating-gate layer 216. At this point, the floating-gate layer 216 is fully charged. The negative charge from the hot electrons collected in the floating-gate layer 216 raises the cell's threshold voltage (Vt) above a logic 1 voltage.

Electrons are removed from the floating-gate layer 216 to erase the memory cell 300. Many memories, including flash memories, use Fowler-Nordheim (FN) tunneling to erase a memory cell. The erase procedure may be accomplished by electrically floating the drain region 208, grounding the source region 206 through the lower well region 202, and applying a high negative voltage (e.g., −12 volts) to the control-gate layer 220. This creates an electric field across the tunnel dielectric layer 214 and forces electrons off of the floating-gate layer 216 which then tunnel through the tunnel dielectric layer 214. Erasures are generally carried out in blocks rather than individual cells. For an erased floating-gate memory cell, the memory cell's Vt is brought to a level below a logic 1 level.

The erase procedure also may be accomplished using a channel erase procedure. In this procedure, a positive voltage is applied to the upper well region 204 to bring the channel regions up to the positive voltage, the lower well region 202 is floated to float the source regions 206, the drain regions 208 are floated, and a negative voltage is applied to the control-gate layer 220. Alternatively, the lower well region 202 and/or the drain regions 208 may also be brought to the positive voltage of the upper well region 204. Again, in any case, the electric field across the tunnel dielectric layer 214 forces electrons off of the floating-gate layer 216.

In a read operation, a bit line coupled to the drain region 208 of a memory cell is generally brought to a precharge potential such as the supply potential Vcc. A lower potential is applied to the source region 206 of the memory cell through the lower well region 202. This lower potential may be the ground potential Vss. A logic 1 level is applied to the control-gate layer 220 and the bit line is isolated from the precharge potential. If the memory cell is in the first programmed state, i.e., programmed, the gate bias will be less than or very near the memory cell's Vt such that minimal or no current will flow between the drain region 208 and the source region 206. If the memory cell is in the second programmed state, i.e., erased, the gate bias will be higher than the memory cell's Vt such that substantially more current will flow between the drain region 208 and the source region 206. Sensing devices, such as sense amplifiers, are used in the memory device to detect and amplify the programmed state of the memory cell 300 detected on the bit line 228 during a read operation. The memory cell 300 is coupled to a sense amplifier and the appropriate sense amplifier is coupled to a data output register in response to control signals received from a column decoder circuit. Thus, a memory cell is selected by a decoded address and data is read from the memory cell based upon the level of current between the drain region 208 and the source region 206 determined by the memory cell's level of activation.

CONCLUSION

As packing of floating-gate memory cells becomes more dense, resistance levels of source-line connections become more difficult to manage. Floating-gate memory cells of the various embodiments are formed in a first semiconductor region having a first conductivity type. This first semiconductor region is separated from the underlying substrate by an interposing second semiconductor region having a second conductivity type different from the first conductivity type. The source regions of the memory cells are coupled to the second semiconductor region as a common source line. In this manner, source-line resistance is improved without the need for metal lines or other low-resistance straps placed at regular intervals across the memory array, thus permitting tighter packing of memory cells. Eliminating these straps can facilitate an array size reduction of 10–15% or more over current practice.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of reading a floating-gate memory cell, comprising:
applying a first potential to a control gate of the floating-gate memory cell, wherein the first potential is greater than a threshold voltage of the memory cell in a first programmed state and less than a threshold voltage of the memory cell in a second programmed state, wherein the floating-gate memory cell has a drain region and a source region in a first well region having a first conductivity type, and wherein the first well region is in a second well region having a second conductivity type different from the first conductivity type;
applying a second potential to the second well region, wherein the second well region is coupled to the source region;
applying a precharge potential to a bit line coupled to the drain region; and
sensing a current between the drain region and the source region after isolating the bit line from the precharge potential and while the second potential is applied to the second well region, wherein a level of the current is indicative of the programmed state of the memory cell.

2. The method of claim 1, wherein the first conductivity type is a p-type and the second conductivity type is an n-type.

3. The method of claim 1, wherein the precharge potential is a supply potential and the second potential is a ground potential.

4. The method of claim 1, wherein the second well region is an n-type well region formed in a p-type semiconductor substrate and the first well region is a p-type well region formed in the n-type well region.

5. The method of claim 1, wherein the second well region is an n-type well region formed in a p-type semiconductor substrate through controlled-depth dopant implantation and the first well region is a p-type well region defined during the controlled-depth dopant implantation.

6. The method of claim 1, wherein the method is performed in the order presented.

7. A method of programming a floating-gate memory cell, comprising:
applying a first potential to a control gate of the floating-gate memory cell, wherein the floating-gate memory cell has a drain region and a source region in a first well region having a first conductivity type, and wherein the first well region is in a second well region having a second conductivity type different from the first conductivity type;
applying a second potential to the drain region; and
applying a third potential to the second well region, wherein the second well region is coupled to the source region.

8. The method of claim 7, wherein the first conductivity type is a p-type and the second conductivity type is an n-type.

9. The method of claim 7, wherein the first potential is higher than the second potential and the second potential is higher than the third potential.

10. The method of claim 7, wherein the first potential is a first positive potential, the second potential is a second positive potential lower than the first positive potential, and the third potential is a ground potential.

11. The method of claim 7, wherein the method is performed in the order presented.

12. A method of erasing a floating-gate memory cell, comprising:
applying a first potential to a control gate of the floating-gate memory cell, wherein the floating-gate memory cell has a drain region and a source region in a first well region having a first conductivity type, and wherein the first well region is in a second well region having a second conductivity type different from the first conductivity type; and applying a second potential to the first well region and the second well region, wherein the second potential is higher than the first potential and wherein the second well region is coupled to the source region.

13. The method of claim 12, wherein the first conductivity type is a p-type and the second conductivity type is an n-type.

14. The method of claim 12, further comprising:

electrically floating the drain region.

15. The method of claim 12, wherein the second potential is a positive potential and the first potential is a negative potential.

16. The method of claim 12, wherein the method is performed in the order presented.

17. A method of erasing a floating-gate memory cell, comprising:

applying a first potential to a control gate of the floating-gate memory cell, wherein the floating-gate memory cell has a drain region and a source region in a first well region having a first conductivity type, and wherein the first well region is in a second well region having a second conductivity type different from the first conductivity type;

applying a second potential to the first well region, wherein the second potential is higher than the first potential; and electrically floating the second well region, wherein the second well region is coupled to the source region.

18. The method of claim 17, wherein the first conductivity type is a p-type and the second conductivity type is an n-type.

19. The method of claim 17, further comprising:

electrically floating the drain region.

20. The method of claim 17, wherein the second potential is a positive potential and the first potential is a negative potential.

21. The method of claim 17, wherein the method is performed in the order presented.

22. A method of erasing a floating-gate memory cell, comprising:

applying a first potential to a control gate of the floating-gate memory cell, wherein the floating-gate memory cell has a drain region and a source region in a first well region having a first conductivity type, and wherein the first well region is in a second well region having a second conductivity type different from the first conductivity type;

applying a second potential to the first well region, wherein the second potential is higher than the first potential; and electrically floating the second well region and the drain region, wherein the second well region is coupled to the source region.

23. The method of claim 22, wherein the method is performed in the order presented.

* * * * *